United States Patent [19]
Jones et al.

[11] Patent Number: 5,380,401
[45] Date of Patent: Jan. 10, 1995

[54] METHOD TO REMOVE FLUORINE RESIDUES FROM BOND PADS

[75] Inventors: Curtis S. Jones; William J. Crane; Robin L. Gilchrist; Rod C. Langley, all of Boise, Id.

[73] Assignee: Micron Technology, Inc., Boise, Id.

[21] Appl. No.: 4,371

[22] Filed: Jan. 14, 1993

[51] Int. Cl.⁶ .......................................... H01L 21/00
[52] U.S. Cl. ................... 156/665; 156/651; 156/652; 156/643; 156/646; 134/1; 204/192.35
[58] Field of Search ............. 156/643, 646, 665, 667, 156/651, 652; 134/1; 204/192.35

[56] References Cited

U.S. PATENT DOCUMENTS

| | | | |
|---|---|---|---|
| 4,981,550 | 1/1991 | Huttemann et al. | 156/643 |
| 5,202,579 | 4/1993 | Fujii et al. | 257/751 |

FOREIGN PATENT DOCUMENTS 54-060236  5/1979  Japan.

OTHER PUBLICATIONS

J. F. Graves, W. Gurany, "Reliability Effects of Fluorine Contamination of Aluminum Bonding Pads on Semiconductor Chips", Solid State Technology, Oct. 1983, pp. 227–232.

Dusan Grman, Roland Hauert, Egon Hollander, Markus Amstutz, "Surface Analysis of Fluorine Contamination on Microchip Bond Pads", Solid State Technology, Feb. 1992, pp. 43–47.

J. H. Thomas, III, C. E. Bryson, III, T. R. Pampalone, "X-ray Photoelectron Spectroscopy and Surface Charge Build-up Used to Study Residue on Aluminum Contacts on Integrated Circuits", Surface and Interface Analysis, vol. 14, pp. 39–45, 1989.

R. Jay Ritchie, D. Marshall Andrews, "$CF_4/O_2$ Plasma Accelerated Aluminum Metallization Corrosion in Plastic Encapsulated ICs in the Presence of Contaminated Die Attach Epoxies", 1981, pp. 88–92.

T. J. Chuang, H. F. Winters, J. W. Coburn, "An XPS and Auger Investigation of $CF_3+$Ion Bombardment of Silicon", North-Holland Publishing Company, 1978, pp. 515–531.

T. Valand, G. Nilsson, "The Influence of F-Ions on the Electrochemical Reactions on Oxide-Covered Al", Corrosion Science, 1977, vol. 17, pp. 449–459.

R. B. Comizzoli, R. P. Frankenthal, P. C. Milner, J. D. Sinclair, "Corrosion of Electronic Materials and Devices", Oct. 1986, pp. 340–345.

*Primary Examiner*—R. Bruce Breneman
*Assistant Examiner*—George Goudreau
*Attorney, Agent, or Firm*—Lia M. Pappas

[57] ABSTRACT

The process of the present invention comprises the addition of an adequate amount of argon gas in a dry etch system to clear bond pads of residual contaminants which form an undesired oxide coating on the bond pads. Carbon dioxide may be used as a carrier gas along with the argon gas. The process of the present invention preferably takes place in situ, following the silicon nitride pad etch in which fluorine-containing chemicals are used to form the bond pads.

10 Claims, 2 Drawing Sheets

METHOD TO REMOVE FLUORINE RESIDUES FROM BOND PADS

FIELD OF THE INVENTION

This invention relates to semiconductor manufacturing, and more particularly to a method of removing residual chemicals from bond pad surfaces.

BACKGROUND OF THE INVENTION

Semiconductor components must be interconnected with each other or with package leads in order to perform their intended function. Bond pads located on the semiconductor die are the sites at which such interconnections are made. Aluminum and aluminum alloys are the predominant conductive material used in chip-level metallization, i.e., as bond pads. Aluminum is a metal with a very high chemical reactivity which reacts even with pure water if a protective oxide layer is not present. Unfortunately, however, certain oxide layers frequently interfere with the efficient functioning of the semiconductor device.

During the metal patterning step the aluminum bond pads are defined and etched. Subsequently, a passivation layer is deposited on the device to protect the device throughout the testing and packaging processes. However, the protective layer is first removed from the conductive bond pads through a pad mask patterning step. The pad mask step is typically done in a plasma or dry etch chamber.

After a semiconductor device has undergone the pad mask step, residual fluorine may remain on the bond pads from the etch chemicals, for example $CHF_3$, used in the process. This fluorine residue causes a condition referred to as "gummy pads" which is characterized by an adhesive-like oxide substance remaining on the bond pads, which substance clings to the probe tips during die testing.

The "gummy bond pads" arise because the silicon nitride layer superjacent the aluminum bond pads is typically overetched. Fluorine (F) from the etch process is deposited onto the aluminum of the bond pads, producing an $AlFO_3$ oxide layer on the bond pads. The fluorine acts as an oxidizing agent which creates a greater than normal layer of oxide, thereby resulting in high resistivity, and consequently, low yields when probed.

SUMMARY OF THE INVENTION

The process of the present invention involves the addition of an adequate amount of argon gas in a dry etch system to clear the bond pads of the residual fluorine contaminants which form a resistive oxide coating on the bond pads.

The argon gas is introduced into the dry etch system using a high bias source of excitation to clear the bond pads of the fluorine. For example, when argon is exposed to electromagnetic energy, such as radio frequency (RF) and ionized, an etch that substantially removes a layer of $AlFO_3$ from the bond pads is produced.

The process of the present invention also relates to the addition of a carrier gas such as, carbon dioxide, or an inert gas, such as, helium, xenon, neon, krypton, etc. to the argon. The carrier gas enhances the plasma. The carrier gas stabilizes the plasma, and increases the DC bias which improves the ability of the argon to remove the oxide, or replace the $AlOF_x$. Argon, depending on the reactor, may require a lot of effective power to ionize.

The process of the present invention can also be carried out on a sputter machine, such as Varian, model 3290. The argon sputter of the present invention effectively removes the fluorine residues left after the dry etch process. An argon sputter will remove any residual fluorine that causes excessive oxidation build-up on the bond pad surfaces, thereby improving probe yields, especially with "gummy pad" lots.

Another embodiment of the present invention relates to ionizing oxygen gas ($O_2$) in a Reactive Ion Etcher (RIE) for approximately 3.00 minutes at approximately 150 W and 200 MTorr. The oxygen ions exchange with the fluorine on the aluminum bond pads of the final wafers which removes substantially all of the fluorine residue from the bond pad, which residue causes high resistivity during probe. ("Excess oxidation" or high resistivity will show a good die as bad, eventhough the die itself is really functional.)

One advantage of the process of the present invention is a decrease in the high concentrations of residual fluorine, for example: $AlF_3$, which readily oxidizes when exposed to the atmosphere, and $AlFO_3$, which results in poor pad resistance thereby causing misprobing.

Another advantage of the process of the present invention is the improved bond pad adhesion achieved during wire bond. The argon sputter substantially eliminates any fluorine residue from reaching wire bond, thereby reducing wire bond failures, as well as limits premature part failures resulting from corrosion occurring between the wire bond and the aluminum bond pad caused by fluorine contamination.

Argon sputter is currently used for analysis of wafers, for example an Auger, which sputters argon through a film and sorts the debris by weight. Such a process can not feasibly be done on a manufacturing level. Hence, the process of the present invention which involves the use of argon gas as a means of residue removal is different than the use of argon for analytical purposes.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 3:
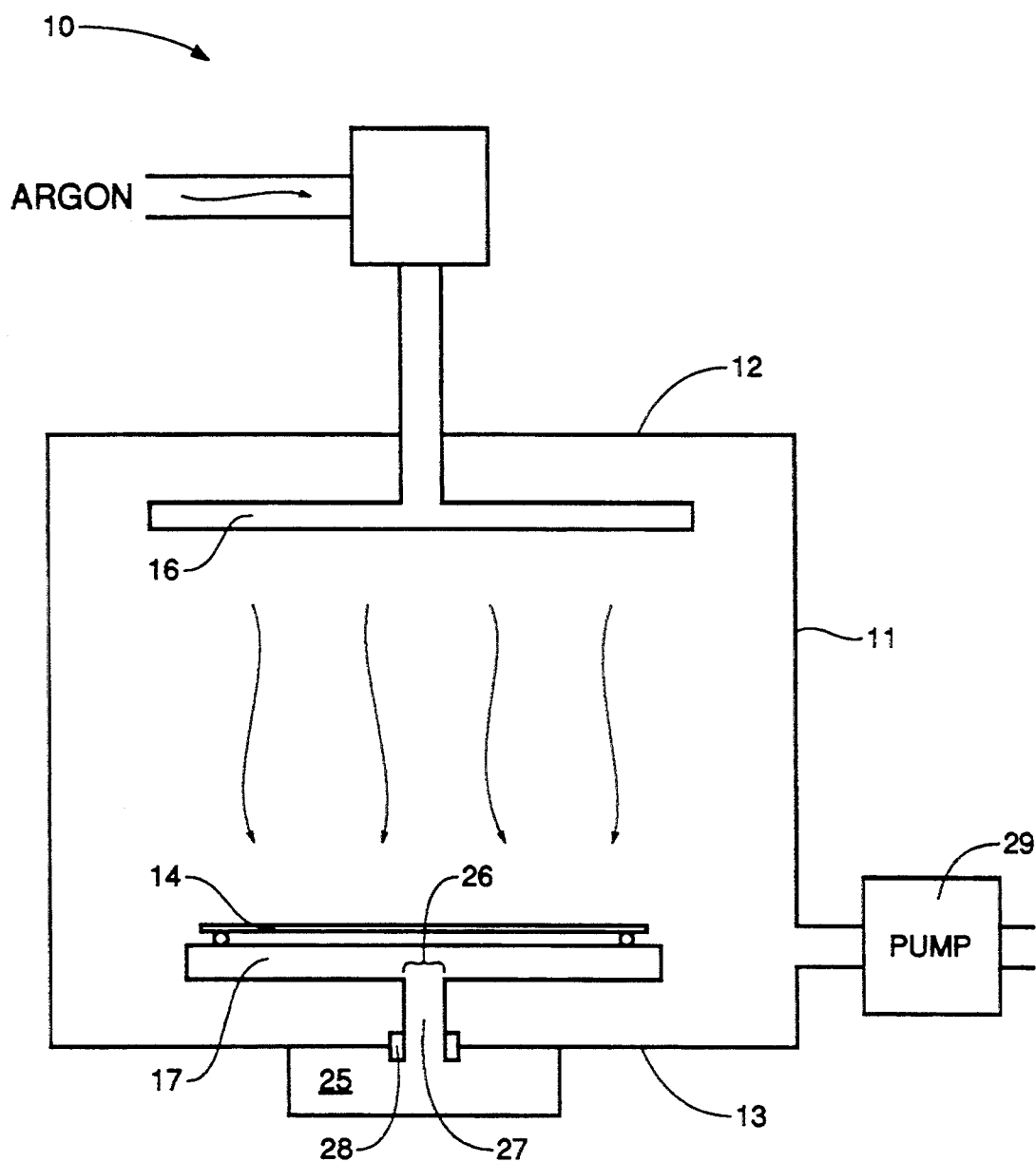
FIG. 3 is a schematic cross-section of a plasma etcher useful in carrying out the process of the present invention.

FIG. 3 is a partial cross-sectional view of a typical plasma etching chamber, generally indicated by the numeral 10. The chamber 10 is comprised of a hollow, cylindrical member 11 having upper and lower end plates 12 and 13, respectively. A pair of cylindrical, spaced apart, disc-shaped top and bottom electrodes 16 and 17, respectively, are positioned within the chamber 10. The bottom electrode 17, which can be made of aluminum or the like, has a central aperture 26 and is fixedly connected to a hollow metal pipe 27 which is insulated from the lower end plate 13 by a hermetic bushing 28. The lower end of pipe 27 is connected to a power source 25, preferably a radio frequency (RF) power source. A vacuum pump 29 serves to maintain a vacuum within chamber 10 and also to remove spent gases therein. A semiconductor wafer 14 is disposed on the bottom electrode 17.

For purposes of this application, and for ease of discussion electrode 16 will be referred to as an anode, and electrode 17 will be referred to as a cathode. It is obvious to one skilled in the art that the anode need not be the top electrode and vice versa.

Figure 1:
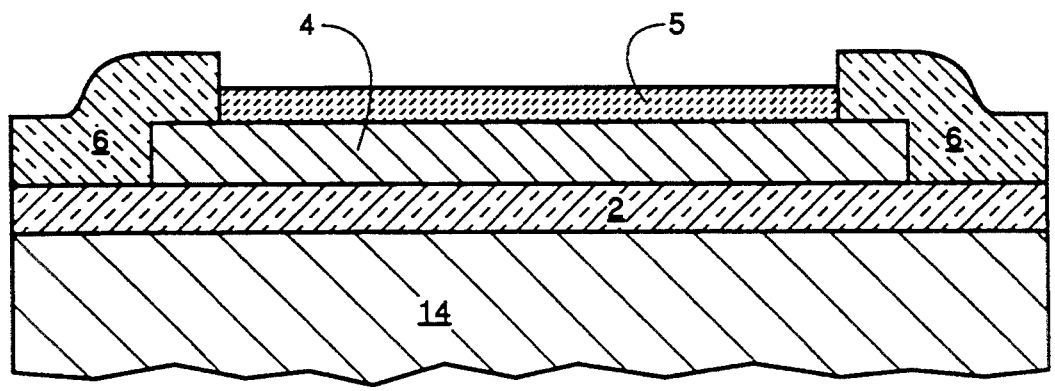
FIG. 1 is a schematic cross-section of a bond pad on which is disposed an undesired contaminant.

Referring to FIG. 1, a problem experienced in manufacturing reliable bonds pads 4 is shown. A conductive bond pad 4 comprised for example of a metal, such as aluminum, or a metal alloy, is disposed on a substrate 14 on which has been grown an oxide layer 2 of a semiconductor device. The conductive pad 4 is frequently oxidized when exposed to atmospheric oxygen, or in some cases, moisture, thereby forming an insulating layer 5. The insulating layer 5 of metallic oxide is undesirable as the insulator 5 tends to interfere with the propagation of electrical signals from the wire bond (not shown) to the bond pad 4, and there onto the semiconductor device, and vice versa. Hence, prior to the formation of the interconnect (not shown), a source of contamination (and possible failure) is already present in the device. The presence of fluorine in the oxide layer 5 exacerbates the problem further by causing the pad 4 to become "gummy."

Figure 2:
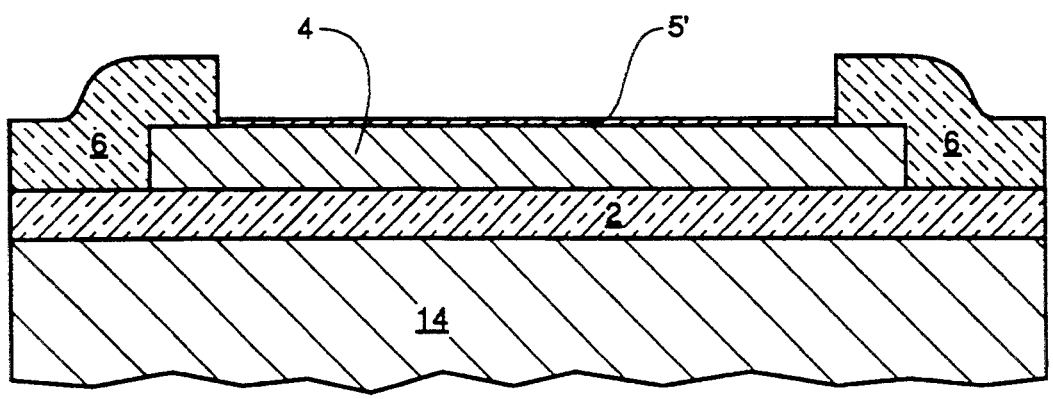
FIG. 2 is a schematic cross-section of the bond pad of FIG. 1, after the undesired contaminant has been removed, according to the process of the present invention.

FIG. 2 illustrates the structure formed by the process of the present invention in which the insulating layer 5 of FIG. 1, and the problems inherent thereto, have been effectively eliminated. Removal of the residual fluorine oxide layer 5 significantly increases the reliability of the device by limiting the opportunities for corrosion, and hence protecting the integrity, of the bond pad 4. However, a small amount (25 Å) of native oxide 5' may remain on the bond pad 4 without having any noticeable effects.

In the process of bond pad 4 formation, the conductive metallic layer 4 is deposited preferably by sputtering, or other suitable method, onto the surface of the semiconductor die.

The conductive metallic layer 4 is then patterned and etched together, by any of the methods known in the art, such as for example, a masked photoresist followed by a dry or plasma etch.

The semiconductor device is typically, passivated with a layer 6 of silicon dioxide and $SiN_3O$. The passivation layer 6 is then removed from the bond pad 4 areas by an etch process. Typically, the etch process is a dry/plasma etch, and is performed in fluorine containing gases, such as $CHF_3$.

Other gases may be used such as, $CF_4$, $C_2F_6$, $C_2F_2$, $C_4F_8$, and etc. These fluorine-containing gases frequently leave a residue 5 on the bond pad 4.

One embodiment of the process of the present invention is to follow up the pad mask etch with a plasma or reactive ion etch, using an inert gas, for example, argon. The etch is preferably performed in situ, i.e., in the same etch chamber as the bond pad etch, as shown in FIG. 3. The in situ process saves time in the manufacturing cycle, and consequently results in cost reduction and increased throughput.

The reactive ion etch is substantially within the range of 150–900 Watts and 200–600 Torr for approximately 5 seconds to 2 minutes. The plasma etch is at approximately 200–2500 Watts and 5 mTorr–3 Torr for approximately 5–120 seconds. However, the preferred parameters for the plasma etch are 600 mTorr and 600 Watts for 30 seconds.

An alternative embodiment of the present invention is to rework those wafers 14 that have been probed, and have been found to contain significant (detrimental) amounts of $AlFO_3$. The wafers 14 containing "gummy pads" 4 are placed in a sputter machine (not shown), whereupon the wafers 14 are exposed to an argon sputter to substantially remove the excess residue 5 from the bond pad surfaces 4.

Another embodiment of the present invention relates to ionizing oxygen gas ($O_2$) in a reactive ion etcher (RIE) (not shown) for approximately 3 minutes at approximately 150 Watts and 200 MTorr. The oxygen ions exchange with the fluorine 5 on the aluminum bond pads 4 of the final wafers which removes substantially all of the fluorine residue 5 from the bond pad 4, which residue 5 causes high resistivity during probe. The oxygen etches away the aluminum-oxide layer 5 by exchanging with the fluorine molecules. Since oxygen and fluorine molecules are of the same relative size, the molecules exchange easily with each other. Consequently, the fluorine molecules are displaced by the energized oxygen molecules, thereby substantially eliminating the contamination layer 5.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that alternate inert gases may be employed using the above inventive technique to produce the same novel results.

What is claimed is:

1. A process for removing fluorine contaminants from an aluminum-containing semiconductor bond pad, said process comprising the following steps:
    exposing the aluminum-containing bond pad to argon, the aluminum bond pad being exposed to argon in a reactive ion etcher; and
    applying energy to said argon, a carrier gas being added to said argon, said carrier gas being carbon dioxide, thereby removing the fluorine contaminants from the aluminum-containing bond pad.

2. A process for removing residual fluorine etch chemicals from an aluminum-containing bond pad, said process comprising the following steps of:
    disposing the aluminum-containing bond pad in a chamber;
    providing an atmosphere in the chamber; and
    creating a plasma in the chamber, said plasma comprises an inert gas, said inert gas comprising argon, said plasma further comprises oxygen, said plasma reacting with the residual fluorine chemicals, thereby removing the residual fluorine chemicals from the aluminum-containing bond pad.

3. The process according to claim 1, wherein said reactive ion etcher is at 150–900 Watts and 200–600 Torr for 5 seconds to 2 minutes.

4. A process for removing fluorine contaminants from an aluminum alloy semiconductor bond pad, said process comprising the following steps:

exposing the aluminum alloy bond pad to argon, the aluminum alloy bond pad being exposed to argon in a reactive ion etcher, said reactive ion etcher is at 150-900 Watts and 200-600 Torr for 5 seconds to 2 minutes; and applying energy to said argon, a carrier gas being added to said argon, said carrier gas being carbon dioxide, thereby removing the fluorine contaminants from the aluminum alloy bond pad.

5. A process for removing residual fluorine etch chemicals from an aluminum-containing bond pad, said process comprising the following steps of:

disposing the aluminum-containing bond pad in an chamber;

providing an atmosphere in the chamber which has a property of removing residual fluorine chemicals from the aluminum-containing bond pad when a plasma is created in said chamber; and applying a plasma in said chamber with said atmosphere, said plasma comprises oxygen, thereby removing the residual fluorine chemicals from the aluminum-containing bond pad.

6. The process according to claim 5, wherein said plasma is created at 150 Watts and 200 MTorr.

7. The process according to claim 6, wherein the aluminum-containing bond pad is exposed to said plasma for approximately three minutes.

8. The method according to claim 2, wherein said plasma is created at 200-2500 Watts and 5 mTorr-3 Torr for 5-120 seconds.

9. The method according to claim 2, wherein said etch chamber is a dry etch chamber.

10. The method according to claim 2, wherein said etch chamber is a reactive ion etch chamber.

* * * * *